United States Patent
Rissing et al.

(10) Patent No.: US 10,645,810 B2
(45) Date of Patent: May 5, 2020

(54) SENSOR FOR MEASURING A POSITION

(71) Applicant: JOHANNES HEIDENHAIN GmbH, Traunreut (DE)

(72) Inventors: Lutz Rissing, Munich (DE); Marc Oliver Tiemann, Waging am See (DE); Alexander Frank, Vachendorf (DE)

(73) Assignee: DR. JOHANNES HEIDENHAIN GmbH, Traunreut (DE)

( * ) Notice: Subject to any disclaimer, the term of this patent is extended or adjusted under 35 U.S.C. 154(b) by 324 days.

(21) Appl. No.: 15/833,527

(22) Filed: Dec. 6, 2017

(65) Prior Publication Data
US 2018/0220533 A1 Aug. 2, 2018

(30) Foreign Application Priority Data

Jan. 30, 2017 (EP) .................................. 17153762

(51) Int. Cl.
*G01B 7/14* (2006.01)
*H05K 1/16* (2006.01)
(Continued)

(52) U.S. Cl.
CPC ............ *H05K 1/165* (2013.01); *G01D 5/142* (2013.01); *G01D 5/16* (2013.01); *G01D 5/20* (2013.01); *G01D 5/2013* (2013.01); *G01D 5/24* (2013.01); *G01D 5/26* (2013.01); *H01L 21/00* (2013.01); *H01R 4/023* (2013.01); *H01R 4/027* (2013.01); *H01R 4/34* (2013.01); *H01R 12/63* (2013.01); *H05K 1/028* (2013.01); *H05K 1/189* (2013.01); *H05K 2201/056* (2013.01); *H05K 2201/10121* (2013.01); *H05K 2201/10151* (2013.01);
(Continued)

(58) Field of Classification Search
CPC . G01B 7/023; G01B 7/14; G01B 7/30; G01D 5/16; G01D 5/20; G01D 5/26; G01D 5/24; G01D 5/142; G01D 5/145; G01D 5/2013; H05K 1/028; H05K 1/165; H05K 1/189
See application file for complete search history.

(56) References Cited

U.S. PATENT DOCUMENTS 6,313,624 B1 11/2001 Alhorn et al.
7,157,903 B2 1/2007 Rissing
(Continued)

FOREIGN PATENT DOCUMENTS

DE 10307674 A1 9/2004

*Primary Examiner* — Minh N Tang
(74) *Attorney, Agent, or Firm* — Hunton Andrews Kurth LLP

(57) ABSTRACT

A sensor for measuring the position of a component that is displaceable relative to the sensor, includes a circuit board and a metal body. The circuit board includes a first region in which a detector is located, and a second region in which electronic components are located, which are electrically connected to the detector. The metal body includes a first layer having a first area as well as a second layer having a second area. The first region of the circuit board is fixed in place in the first area and the second region of the circuit board is fixed in place in the second area. The first layer and the second layer of the metal body are situated between the first region and the second region of the circuit board so that the first region is located in a first plane and the second region is located in a second plane.

19 Claims, 6 Drawing Sheets

(51) Int. Cl.
*G01D 5/20* (2006.01)
*H01L 21/00* (2006.01)
*G01D 5/14* (2006.01)
*G01D 5/16* (2006.01)
*G01D 5/24* (2006.01)
*G01D 5/26* (2006.01)
*H01R 4/02* (2006.01)
*H01R 4/34* (2006.01)
*H01R 12/63* (2011.01)
*H05K 1/02* (2006.01)
*H05K 1/18* (2006.01)

(52) U.S. Cl.
CPC .............. *H05K 2201/10356* (2013.01); *H05K 2201/10409* (2013.01); *H05K 2201/10522* (2013.01)

(56) References Cited

U.S. PATENT DOCUMENTS

| | | | |
|---|---|---|---|
| 8,274,275 B2 * | 9/2012 | Steinich | G01B 7/30 324/207.25 |
| 8,878,313 B2 * | 11/2014 | Salmaso | G01L 9/0042 257/415 |
| 9,605,980 B2 * | 3/2017 | Reusing | F16C 29/00 |
| 2002/0011839 A1 | 1/2002 | Miyata et al. | |
| 2015/0362340 A1 | 12/2015 | Montagne | |

\* cited by examiner

SENSOR FOR MEASURING A POSITION

CROSS-REFERENCE TO RELATED APPLICATIONS

The present application claims priority to Application No. 17153762.4, filed in the European Patent Office on Jan. 30, 2017, which is expressly incorporated herein in its entirety by reference thereto.

FIELD OF THE INVENTION

The present invention relates to a sensor for measuring a position, e.g., for an angle-measuring or a length-measuring device.

FIELD OF THE INVENTION

Angle-measuring devices are used as rotary encoders for determining the angular position of two machine components that are rotatable relative to each other. Length-measuring devices are used to measure a linear displacement of two machine components that are displaceable relative to each other. Angle-measuring devices and length-measuring devices are usually equipped with sensors which scan components that are displaceable relative to the sensors such as angle scales or linear scales or scale tapes, and generate position-dependent signals.

In the case of inductive measuring devices, excitation lines and receiver lines, e.g., in the form of circuit traces, are frequently applied on a shared circuit board of an inductive sensor that is fixedly connected to a stator of a rotary encoder, for example. Arranged opposite from this circuit board is an angle scale on which electrically conductive and non-conductive areas or webs and gaps are applied in alternation at periodic intervals as a graduation structure. For example, the angle scale is fixedly connected to the rotor of the rotary encoder. When a temporally varying electrical excitation current is applied to the excitation lines or field coils, then position-dependent signals are generated in the receiver lines or the receiver coils during the relative movement. These signals are then further processed in an evaluation electronics system of the inductive sensor.

In optical measuring devices, light sources and photodetectors are frequently mounted on a circuit board of an optical sensor. Situated across from the circuit board, separated by an air gap, is an optical scale. It is possible to generate position-dependent signals according to, e.g., conventional, principles.

Such measuring systems or measuring devices are frequently used for electrical drives, for the purpose of determining the relative movement or the relative position of corresponding machine components. In this case, the generated positional values are supplied via a corresponding interface system to subsequent electronics for actuating the drives.

German Published Patent Application No. 103 07 674 describes an angle-measuring device, in which the particular sensor has two circuit boards that are sandwiched together.

SUMMARY

Example embodiments of the present invention provide a sensor which allows for an operating behavior that is robust with regard to external influences and which is able to be produced in a relatively economical manner.

The sensor for the position measurement of a component that is displaceable relative to the sensor includes a circuit board and a metal body. The circuit board has a first region in which a detector is provided, and it has a second region in which electronic components are located. The components are electrically connected to the detector, in particular, by circuit traces on the circuit board. The metal body includes at least two layers; a first area or surface is allocatable to a first layer, and a second area or surface is allocatable to a second layer. Accordingly, the metal body has the first layer including the first area as well as the second layer including the second area. The first region of the circuit board is fixed in placed in the first area, and the second region of the circuit board is fixed in place in the second area. The first layer and the second layer of the metal body are arranged between the first region of the circuit board and the second region of the circuit board, so that the first region of the circuit board is located in a first plane and the second region of the circuit board is located in a second plane.

A bonding gap may be arranged between the first layer and the second layer of the metal body, i.e., a gap that is filled with an adhesive. In other words, the layers of the metal body are integrally connected to one another by an adhesive bond.

As an alternative, the layers of the metal body may also be soldered to one another so that a solder material is provided between the first layer and the second layer of the metal body, in particular. As an alternative, the layers of the metal body may also be welded to one another.

However, an alternative configuration may be provided, in which no adhesive gap is present between the first layer and the second layer of the metal body, and in which the layers of the metal body are held together by extrusion coating, in particular using a plastic material or a silicone material. In this type of configuration, the metal body may thus be produced jointly with the circuit board, by folding, and be extrusion-coated in this state.

For example, the first layer of the metal body includes a third area or surface, and the second layer of the metal body has a fourth area or surface. The third area and the fourth area are arranged so as to face each other. In particular, the first area and the third area of the first layer of the metal body are located opposite each other. In the same manner, the second area and the fourth area, which are allocated to the second layer of the metal body in each case, are disposed so as to lie opposite each other.

If a bonding gap is present, the third area and the fourth area, in particular, are set apart from each other by the bonding gap. The bonding gap is thus disposed between the third area and the fourth area, in particular.

The first area, the second area, the third area, and the fourth area of the metal body or the layers of the metal body may be arranged parallel to one another.

In addition, the metal body may include fastening device (s) for the mechanical attachment of the sensor to a machine component, which may include a bore hole through the first layer and/or the second layer of the metal body. In particular, the metal body may therefore not only be the carrier of the circuit board but simultaneously also function as a flange. For example, projecting tabs that include bore holes may be provided, which are used for attaching the sensor to a machine component.

A thermally insulating layer may be provided between the first layer and the second layer of the metal body. In this type of configuration, in particular, only the first layer or only the second layer may include the fastening device. For example, if components in the first region of the circuit board are relatively insensitive to temperature, then the first layer may be fastened to a relatively hot component, and a heat flow in the direction of the second layer, and thus to possibly more temperature-sensitive components in the second region of the circuit board, may be hampered by the insulating layer.

In addition, the metal body may be arranged such that it has a mechanically processed contour, which may be used as a reference or a stop for the accurate mounting on a machine component.

The sensor may include a cable provided with a shield, which is connected to the metal body in an electrically conductive manner. As a result, the metal body makes it possible to establish a ground connection of the sensor. For example, the shield may be connected to the metal body with the aid of a clip and a screw or rivet connection.

As an alternative, for example, the metal body may also be arranged such that it includes a contact piece, such as a clip band, which is premolded on the metal body and connected to the shield during the production of the sensor, for instance through press-fitting. Such a clip band may be provided as an integral component of the metal body. The contact piece may be premolded on the second layer of the metal body, i.e., specifically only on the second layer, so that the first layer does not include an integrally molded contact piece in this instance.

The circuit board may be flexible and may be provided as one piece. Furthermore, the circuit board may include a curved connection web between the first region and the second region. The circuit board may include a plurality of layers and may include a polyimide or epoxy material. The circuit board may have a thickness of less than 200 μm, e.g., less than 120 μm, reference being made here specifically to the thickness of the substrate of the circuit board and not to the height of the components mounted on the circuit board.

The metal body may be arranged as one piece and may have a flexible web, which is curved and connects the first layer to the second layer.

The section of the metal body situated between the first and the second region of the circuit board may have a thickness of more than 0.5 mm, e.g., more than 0.8 mm or more than 1.0 mm. In other words, the distance between the first region of the circuit board and the second region of the circuit board in particular equals the thickness of the metal body in that section. Furthermore, the metal body may be arranged such that the first layer and the second layer each have the same thickness or gauge. The metal body may have a thickness between the first and the second regions of the circuit board which is at least five times, in particular at least eight times or at least ten times greater than the thickness of the circuit board or the substrate of the circuit board. The metal body may be arranged as a rigid body and may form a mechanical carrier for the thin flexible circuit board. As a result, the term 'metal body' does not encompass a flexible metal foil in the following text.

For example, the sensor may also be based on an optical principle so that the detector may then be provided in the form of a photodetector or a photodetector array. As an alternative, the sensor may be based on a magnetic principle, the detector then possibly being arranged in the form of one or more magnetoresistive element(s) or Hall-effect element(s). In the same manner, a sensor based on a capacitive principle may be provided. The sensor may be based on an inductive measuring principle, in which case the detector may be arranged in the form of receiver coils. In such a case, the sensor may be referred to as an inductive sensor.

In particular when the sensor is based on an inductive measuring principle, the metal body may be produced from a ferromagnetic steel, in particular a magnetically soft steel. As an alternative, for example, it is also possible to use aluminum as the material for the metal body.

In a sensor based on an inductive measuring principle, field coils may be provided in the first region of the circuit board. Electronic components that are electrically connected to the field coils may then be disposed in the second region, in particular, so that the excitation currents generated by the components are able to be transmitted to the field coils.

Because of the special configuration of the sensor, it is possible to use a production method in which a metal sheet is first coated with the substrate of a flexible, in particular a multi-layer, circuit board, or in which such a substrate is applied in a bonding process, so that the circuit board is fixed in place on the surface of the metal sheet in this manner. The layer structure of the circuit board may be produced on the metal sheet, so that no premanufactured circuit boards including the substrate and circuit structures are actually used. Instead, in this variant, the required (e.g., photochemical) process steps for constructing the, e.g., multi-layer circuit board are performed on the metal sheet.

Individual metal parts together with the circuit boards or the substrate may subsequently be separated. After the folding and possibly bonding, the metal body is produced. The electronic components, for example, may be mounted on the circuit board prior to and/or following the folding operation. The substrate of the circuit board is able to be applied on the metal board in the form of a sheet and be separated and singulated together with the metal sheet. As an alternative, it is also possible to mount individual circuit boards on the metal sheet or to glue them to the metal sheet, so that the metal sheet is cut or separated around these circuit boards.

According to a further aspect, a position-measuring device includes a sensor and a component that has a scale and is able to be displaced relative to the sensor. The sensor is arranged and intended for scanning the scale and thereby allows the sensor to generate signals that include information pertaining to the relative position between the sensor and the component. The position-measuring device may be arranged as a linear position-measuring device for measuring relative linear displacements, or else it may be arranged as an angle-measuring device for measuring relative angular positions.

Further features and aspects of example embodiments of the present invention are described in more detail below with reference to the appended Figures.

DETAILED DESCRIPTION

During the production process of an inductive sensor according to an example embodiment of the present exemplary embodiment, a metal sheet, which has a gauge or thickness of 1.0 mm and is produced from magnetically soft steel (in this instance, a ferritic stainless steel) is first provided. A number of flexible circuit boards 1 is mounted on this metal sheet according to a predefined pattern, in particular in a bonding process. Each circuit board 1 has a relatively thin substrate (0.1 mm in this case), e.g., of polyimide, so that they exhibit flexibility as such.

Figure 1:
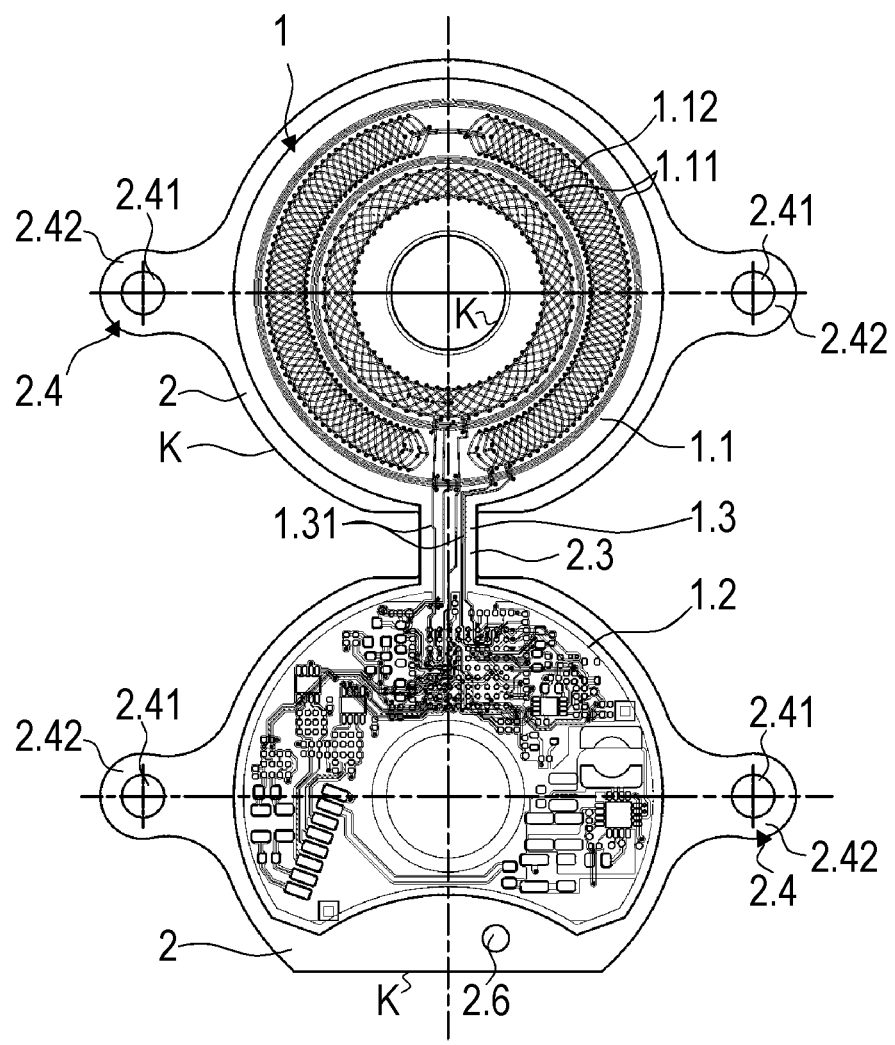
FIG. 1 is plan view of a sensor according to an example embodiment of the present invention in an early assembly phase.

FIG. 1 illustrates a flexible circuit board 1 that includes a plurality of layers. It is arranged in one piece and has a first region 1.1, which is in the form of a ring. In addition, circuit board 1 has a second region 1.2, which is likewise ring-shaped. Circuit board 1 includes a third region 1.3 between first region 1.1 and second region 1.2, which is arranged as a web and represents a connection between first region 1.1 and second region 1.2.

In the production state illustrated in FIG. 1, the circuit pattern of circuit board 1 is visible. Accordingly, what are referred to as field coils 1.11 and a detector 1.12 in the form of receiver coils, which are arranged as circuit traces on the thin substrate, are provided in first region 1.1. In the exemplary embodiment illustrated, two tracks are allocated to detector 1.12 or to the receiver coils. Illustrated in second region 1.2 of circuit board 1 are circuit traces and pads. Circuit traces 1.31, which are used for the electrical connection of the components in first region 1.1 and those in second region 1.2 of circuit board 1, are also applied in third region 1.3 of circuit board 1.

Once the flexible circuit boards 1 have been bonded to the metal sheet according to a predefined pattern, a metal body 2 is cut out along contour K from the metal sheet in a subsequent production step, using a cutting process or a laser or water-jet cutting process, for instance. Metal body 2 is arranged as one piece, and a web 2.3 of metal body 2 is disposed below third region 1.3 of circuit board 1. In addition, fastening devices 2.4 in the form of bore holes 2.41 in tabs 2.42 are provided, as is a threaded bore 2.6. In addition, web 2.3 of metal body 2 is processed such that it has a reduced thickness D23 (see FIG. 3) at least regionally.

In the next step, electronic components 1.21 are able to be mounted in second region 1.2. In the exemplary embodiment illustrated, an ASIC component 1.211 is among such electronic components.

Figure 2:
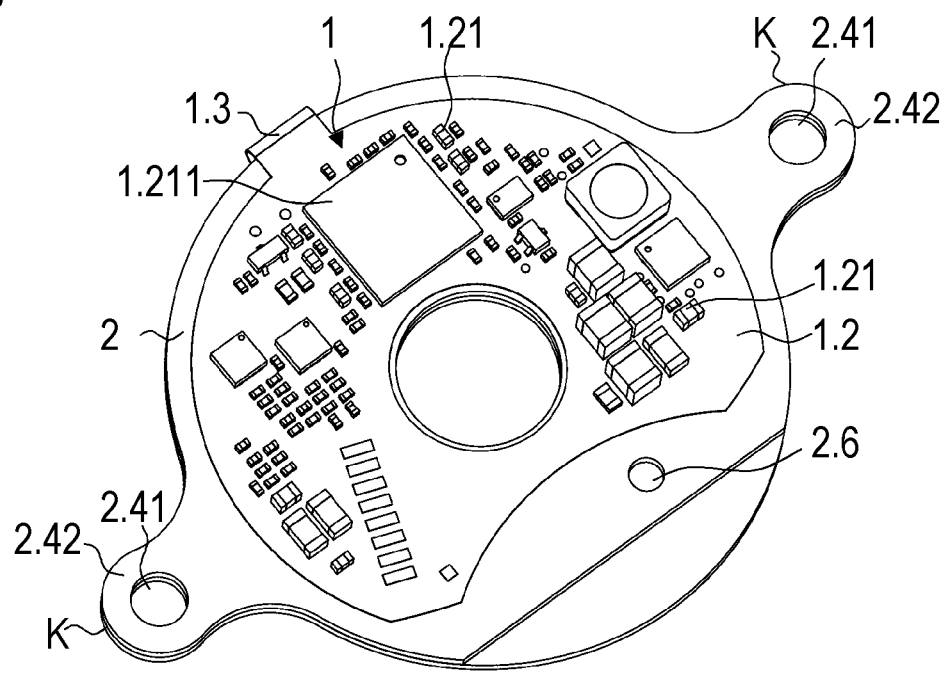
FIG. 2 is a perspective view of the sensor.
Figure 4:
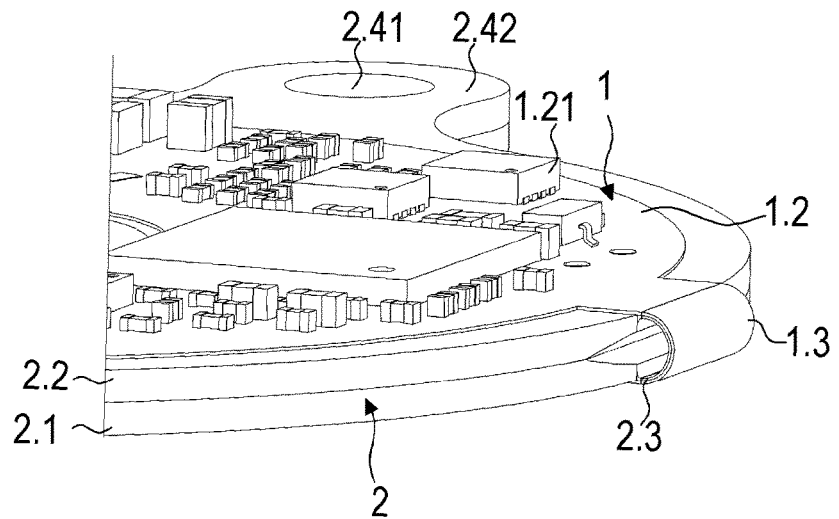
FIG. 4 is a perspective partial view of the sensor.

Subsequently, an adhesive agent is applied on the lower side of metal body 2, whereupon circuit board 1 and metal body 2 are folded together such that a respective pair of bore holes 2.41 comes to lie on top of each other (see FIG. 2 or FIG. 4).

Figure 3:
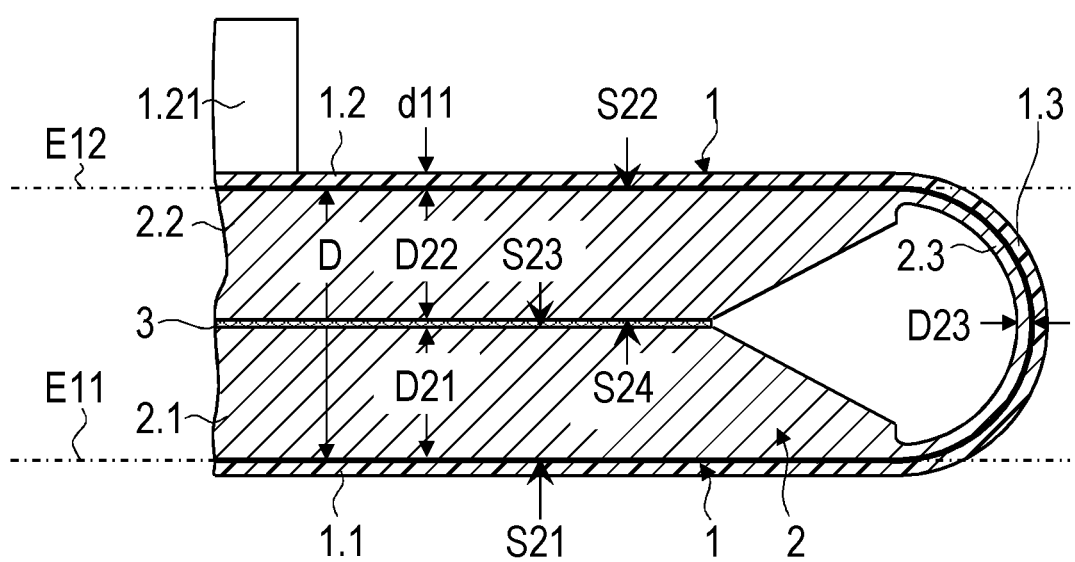
FIG. 3 is a cross-sectional view of a sub-region of the sensor.

FIG. 3 is a partial cross-sectional view through the sensor in the region of web 2.3 of metal body 2. Accordingly, the sensor includes a folded metal body 2, which includes a first layer 2.1 having a first area S21 as well as a second layer 2.2 which includes a second area S22. First region 1.1 of circuit board 1 is bonded to first area S21, and second region 1.2 of circuit board 1 is bonded to second area S22. First layer 2.1 and second layer 2.2 of metal body 2 are arranged between first region 1.1 and second region 1.2 of circuit board 1, with the result that first region 1.1 is disposed in a first plane E11, and second region 1.2 is disposed in a second plane E12. A bonding gap 3 is located between first layer 2.1 and second layer 2.2 of metal body 2. In the exemplary embodiment illustrated, first plane E11 and second plane E12 are arranged parallel to each other.

In addition, first layer 2.1 of metal body 2 has a third area S23, and second layer 2.2 of metal body 2 has a fourth area S24. Third area S23 and fourth area S24 are arranged so as to face each other and are set apart from each other by a bonding gap 3.

Because web 2.3 of metal body 2 has a reduced thickness D23, it is flexible so that metal body 2 together with flexible circuit board 1 or web 1.3 of circuit board 1 is able to be bent without any problems. In the exemplary embodiment illustrated, the gauge or thickness D21 of first layer 2.1 of 1.0 mm is exactly the same as thickness D22 of second layer 2.2. Thickness D23 of third layer 2.3 amounts to 0.1 mm in this example embodiment. Circuit board 1, or the substrate of circuit board 1, features a thickness d11 of 0.05 mm or 50 μm. Since bonding gap 3 has a thickness of approximately 0.05 mm, a total thickness of the metal body of approximately 2.05 mm results, so that metal body 2 has a thickness D between first and second regions 1.1, 1.2 of circuit board 1 that is approximately 41 times greater than thickness d11 of circuit board 1 or the substrate of circuit board 1.

Figure 5:
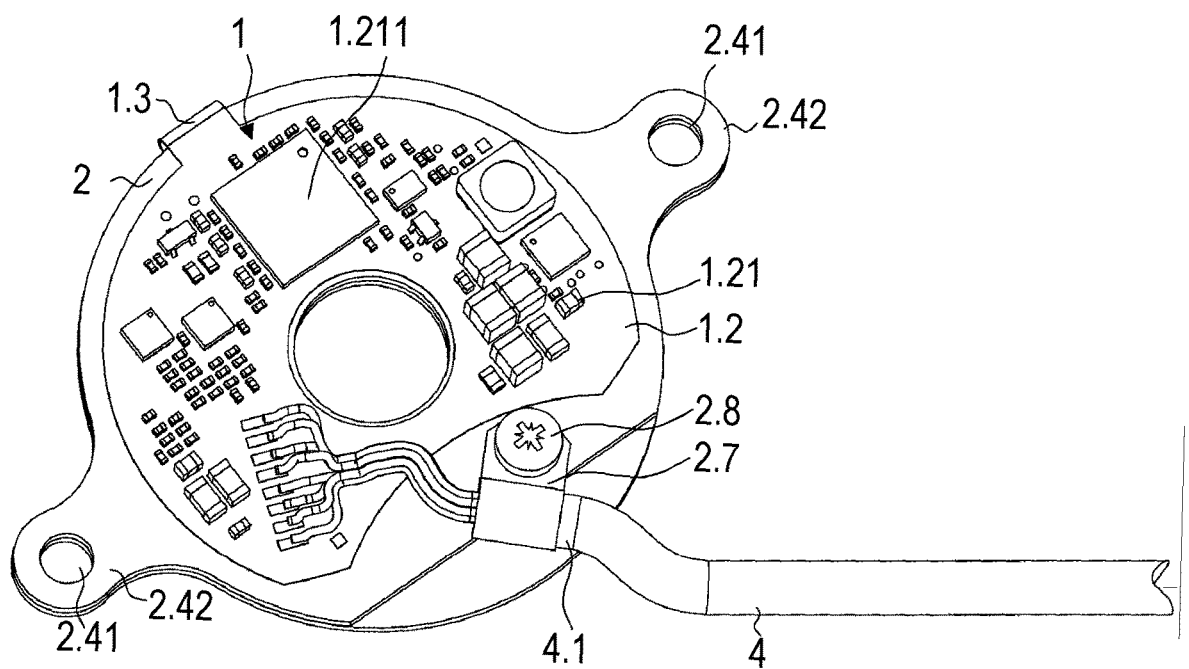
FIG. 5 is a perspective view of the sensor with an installed cable.

In the further course of the production process, the installation of a multi-core cable 4, which includes a shield 4.1 (see FIG. 5), takes place. For this installation, the ends of cores are contacted, especially soldered, to pads provided for this purpose and disposed in second region 1.2 of circuit board 1. In addition, a clip 2.7 is placed around shield 4.1 and fastened to metal body 2 with the aid of threaded bore 2.6 and a screw 2.8. Thus, it is not only a mechanical connection that is produced between metal body 2 and cable 4 but also an electrical connection between metal body 2 and shield 4.1.

The sensor according to the arrangement illustrated in FIG. 1 may be extrusion-coated, for example with an electrically insulating material, so that electronic components 1.21 as well as the connection of cable 4 are protected from external influences. In this case, the extrusion coating may simultaneously also serve as tension relief for cable 4.

As an alternative, it is also possible to perform the extrusion coating or an encapsulation of electronic components 1.21 before metal body 2 is separated from the metal sheet along contour K in an effort to protect electronic components 1.21 from external influences already at this particular stage.

The sensor, for example, may be fastened to a machine component, such as an engine housing. For this purpose, metal body 2 may include fastening devices 2.4 in the form of bore holes 2.41 in tabs 2.42, which act as a flange. In addition, precisely processed contour K may at least regionally serve as a locating surface, so that the installer of the sensor simply has to contact tabs 2.42 with their contour K to correspondingly prepared areas of the machine component and then insert screws through bore holes 2.41 into threaded bores of the machine component. This allows for a simple and precise installation of the sensor.

Figure 6:
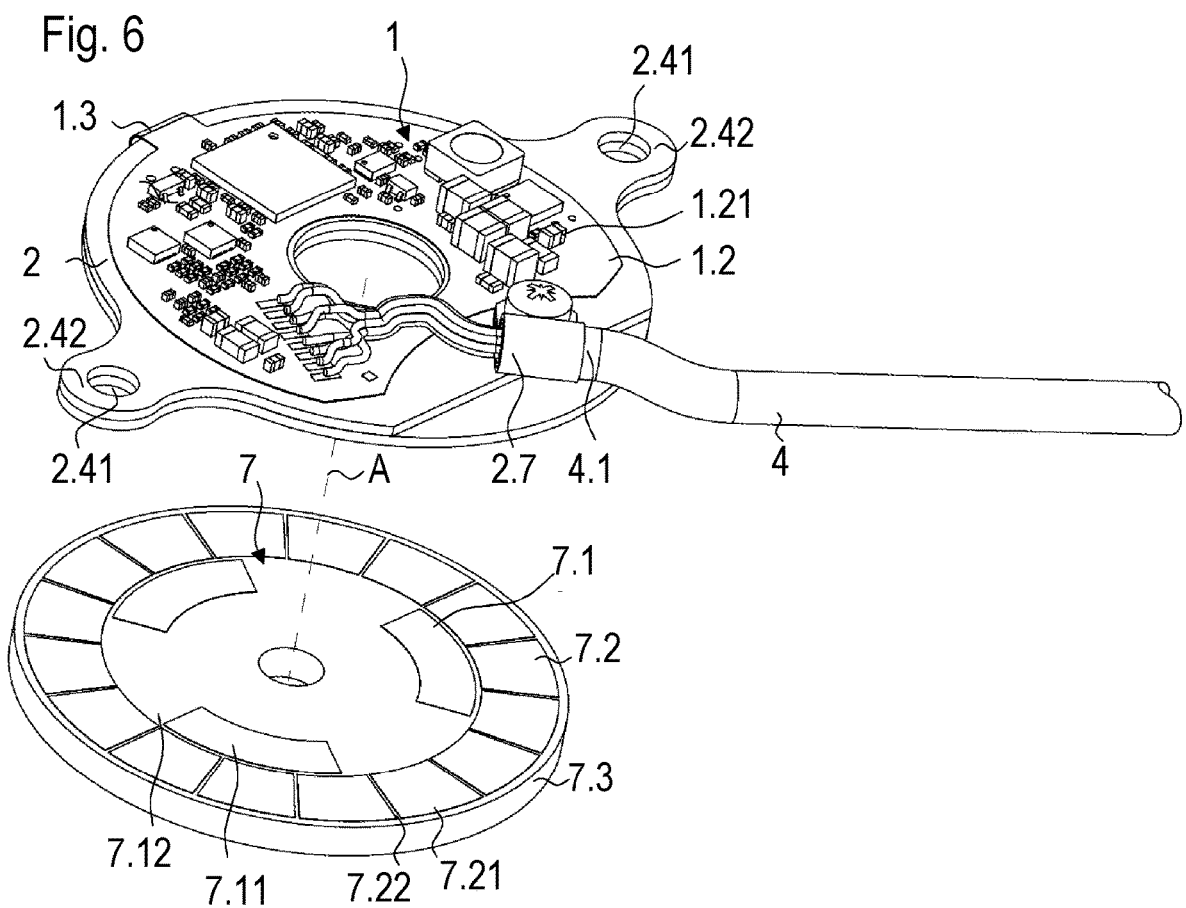
FIG. 6 is a further perspective view of the sensor including a component that is displaceable relative to the sensor.

FIG. 6 schematically illustrates a measuring system. This measuring system includes the sensor, according to an example embodiment of the present invention, and a component 7, which is displaceable relative thereto (in this instance, relative to the sensor) and is arranged as an angle scale in the exemplary embodiment illustrated. Component 7 includes a substrate 7.3, which is produced from an epoxy resin in the exemplary embodiment illustrated, and on which two scale division tracks 7.1, 7.2 are situated. Scale division tracks 7.1, 7.2 are circular in shape and arranged with different diameters on substrate 7.3 in a concentric manner with respect to an axis of rotation A. The two scale division tracks 7.1, 7.2 include a periodic sequence of electrically conductive graduation regions 7.11, 7.21 and non-conductive graduation regions 7.12, 7.22 disposed in alternation in each case. In the example embodiment illustrated, copper is used as the material for electrically conductive graduation regions 7.11, 7.21 and applied on substrate 7.3. In contrast, non-conductive graduation regions 7.12, 7.22 are not coated.

In the example embodiment illustrated, inner scale division track 7.1 includes three graduation regions 7.11 that have electrically conductive material, and of three graduation regions 7.12 in which no conductive material is provided.

Second scale graduation track 7.2 lies on substrate 7.3 radially adjacent to first scale graduation track 7.1. Second scale graduation track 7.2 likewise includes a plurality of electrically conductive graduation regions 7.21 and non-conductive graduation regions 7.22 that are situated therebetween. As far as the material is concerned, the different graduation regions 7.21, 7.22 are arranged in the same manner as graduation regions 7.11, 7.12 of first scale graduation track 7.1. In the illustrated exemplary embodiment, second scale graduation track 7.2 includes a total of sixteen periodically disposed electrically conductive graduation regions 7.21 and, in a corresponding manner, a total of sixteen non-conductive graduation regions 7.22 located therebetween.

Component 7, or the angle scale, usually functions as a rotor and is fixed in place on a machine component that is rotatable about axis of rotation A. The sensor, on the other hand, forms the stator of the position-measuring device arranged as an angle-measuring device, and is therefore mounted on a stationary machine component. In the assembled state of the position-measuring device, component 7 and the sensor are situated opposite each other and are separated by a relatively small air gap, the air gap being smaller than is shown in the schematic illustration of FIG. 6. Axis of rotation A extends through the center of component 7 or the angle scale, and a signal as a function of the respective angular position is able to be generated by induction effects in response to a relative rotation between component 7 and the sensor.

ASIC component 1.211 mounted on circuit board 1 operates not only as an evaluation element but also as an excitation control element under the control of which the excitation current that then flows through field coils 1.11 is generated. The excitation current induces voltages in detector 1.12 as a function of the angular position of component 7 or the angle scale, and these voltages or signals are amplified, demodulated, and converted into digital signals by components 1.21 mounted in second region 1.2 of circuit board 1. The positional values that result from the scanning of individual scale graduation tracks 7.1, 7.2 are ascertained or calculated in logic circuits on the digital part of ASIC component 1.211. The positional values may be transmitted via cable 4 to subsequent electronics, e.g., a numerical control of a machine. An angle-measuring device equipped with the sensor thus is used for acquiring an angular position between the sensor, which is able to be fixed in place on a machine component, and component 7 including the angle scale, which is able to be fixed in place on a second machine component such as a shaft.

Figure 7:
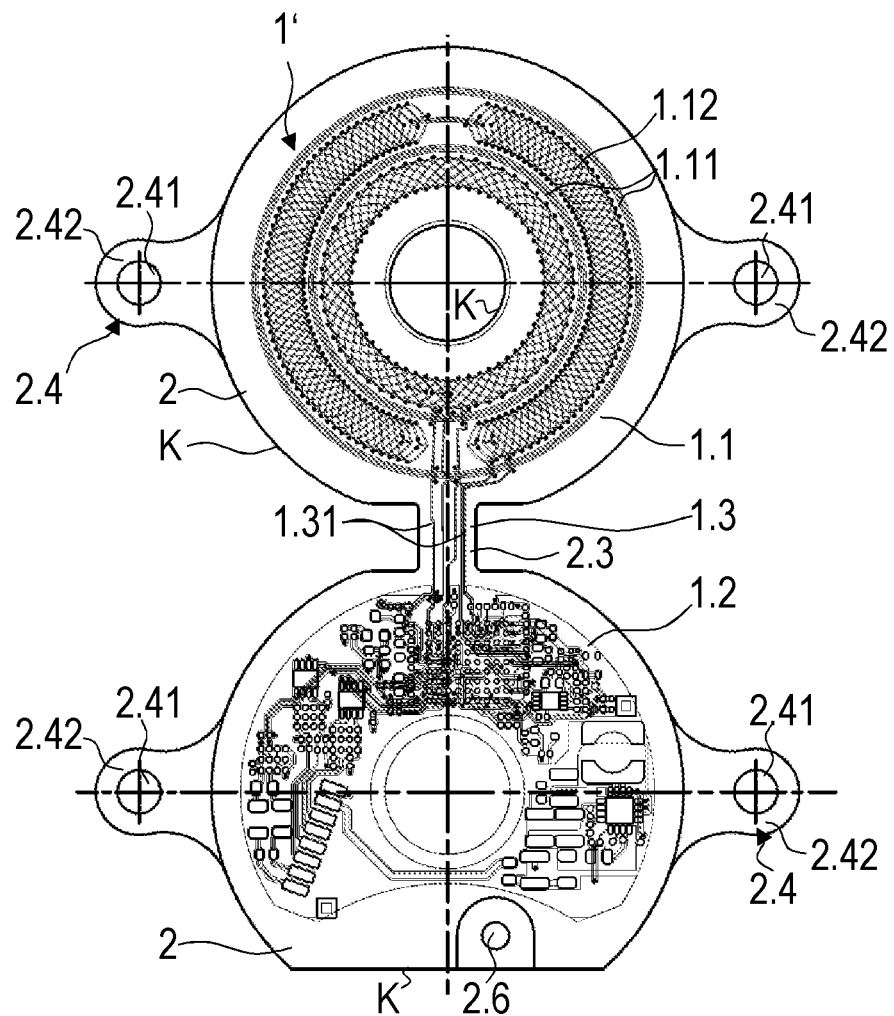
FIG. 7 is a plan view of the sensor according to an example embodiment of the present invention in the early assembly phase.

An alternative configuration of the sensor is described with reference to FIG. 7. In this particular variant, a multi-layer circuit board 1' is built up on the metal sheet. In other words, the multi-layer buildup of circuit board 1' is implemented directly on the metal sheet in this case. In the variant illustrated in FIG. 7, circuit board 1' having a substrate of polyimide is built up using a photochemical or a thin-film process, in which fastening devices 2.4 or tabs 2.42 remain uncoated as does a region around threaded bore 2.6 that serves as the shield connection.

Figure 8:
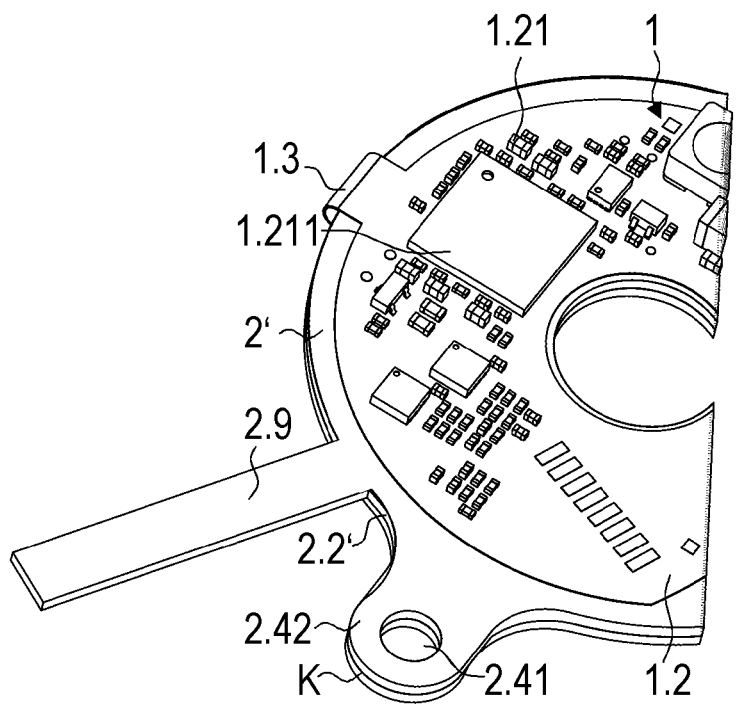
FIG. 8 is a perspective partial view of a metal body for the sensor according to another example embodiment.
Figure 9:
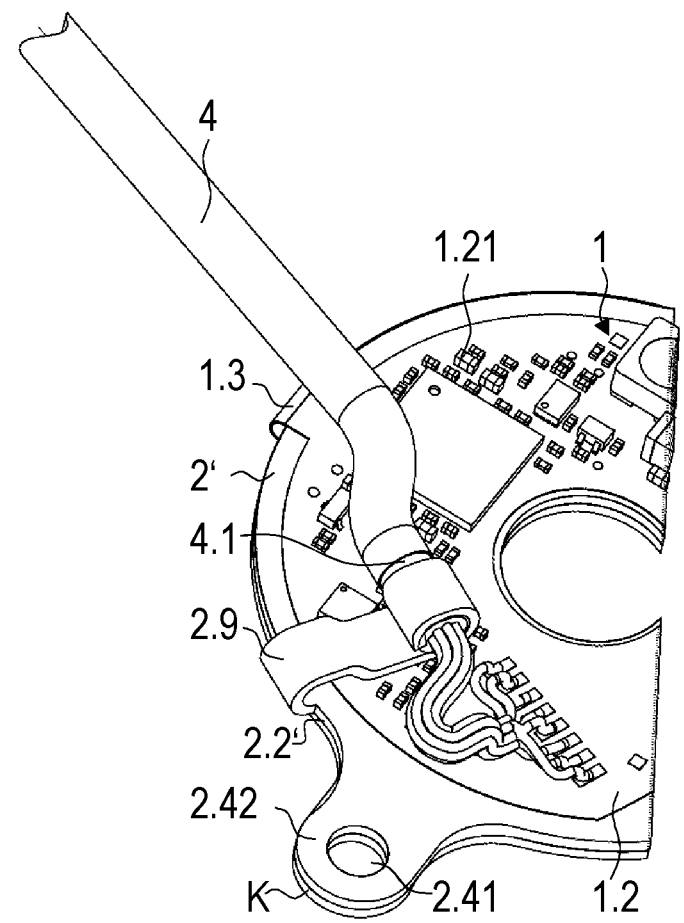
FIG. 9 is a perspective partial view of the metal body for the sensor illustrated in FIG. 8, including the installed cable.

A further example embodiment of the present invention is described with reference to FIGS. 8 and 9. In this case, a contact piece 2.9 is premolded on metal body 2' as an integral component of metal body 2'. In the exemplary embodiment illustrated, contact piece 2.9 is premolded only on second layer 2.2' of metal body 2'. FIG. 8 illustrates the metal body 2' during a production phase prior to the contacting with shield 4.1 of cable 4. Contact piece 2.9 is provided in the form of a band or clamp band, which is connected to shield 4.1 by press-fitting under plastic deformation as illustrated in FIG. 9, thereby establishing secure electrical contacting between shield 4.1 and metal body 2'. Some of electronic components 1.21 tend to generate heat during the operation of the sensor. Because of the special configuration of the sensor, the operating temperature during an existing heat generation is able to be kept relatively low. The reason for this is that the generated heat is able to dissipate through metal body 2, 2' at a relatively low thermal resistivity and, for example, is able to be emitted, especially via tabs 2.42, to the machine component, in particular.

In addition, the configuration described herein provides a sensor, which is not sensitive with regard to influences of external electromagnetic fields inasmuch as metal body 2, which, in particular, is electrically connected to shield 4.1 of cable 4, exhibits a shielding effect of its own.

What is claimed is:

1. A sensor for measuring a position of a component that is displaceable relative to the sensor, comprising:
   a circuit board having a first region, a detector located in the first region, a second region, and electronic components located in the second region and electrically connected to the detector; and
   a metal body having a first layer including a first area and a second layer including a second area;
   wherein the first region of the circuit board is fixed in place in the first area of the metal body, and the second region of the circuit board is fixed in place in the second area of the metal body; and
   wherein the first layer of the metal body and the second layer of the metal body are arranged between the first region of the circuit board and the second region of the circuit board, the first region of the circuit board being located in a first plane, and the second region of the circuit board being disposed in a second plane.

2. The sensor according to claim 1, wherein a bonding gap is arranged between the first layer of the metal body and the second layer of the metal body.

3. The sensor according to claim 1, wherein the metal body includes a fastening device adapted to mechanically fasten the sensor to a machine component.

4. The sensor according to claim 3, wherein the fastening includes a bore hole through the first layer of the metal body and/or the second layer of the metal body.

5. The sensor according to claim 1, wherein the metal body has a contour that is mechanically processed and is arranged as a reference for precise mounting on a machine component.

6. The sensor according to claim 1, wherein the sensor includes a cable having a shield, the shield being connected to the metal body in an electrically conductive manner.

7. The sensor according to claim 6, wherein a contact piece is premolded on the metal body as an integral component of the metal body and press-fit connected to the shield.

8. The sensor according to claim 1, wherein the circuit board is flexible, is arranged as one piece, and has a curved connection web between the first region and the second region.

9. The sensor according to claim 1, wherein the metal body is arranged as one piece and includes a flexible web having a curved shape and connecting the first layer to the second layer.

10. The sensor according to claim 1, wherein a thickness of the metal body is more than 0.5 mm.

11. The sensor according to claim 1, wherein the first layer of the metal body has a third area, and the second layer of the metal body has a fourth area, the third area and the fourth area facing each other.

12. The sensor according to claim 1, wherein the first layer of the metal body has a third area, and the second layer of the metal body has a fourth area, the first area, the second area, the third area, and the fourth area arranged parallel to one another.

13. The sensor according to claim 1, wherein the sensor is arranged as an inductive-measurement sensor, and the detector includes receiver coils.

14. The sensor according to claim 1, wherein the metal body is formed of magnetically soft steel.

15. The sensor according to claim 1, wherein field coils are arranged in the first region of the circuit board.

16. The sensor according to claim 15, wherein electronic components are arranged in the second region and are electrically connected to the field coils.

17. The sensor according to claim 1, wherein the sensor is arranged as an optical sensor, and the detector includes a photodetector and/or a photodetector array.

18. The sensor according to claim 1, wherein the sensor is arranged as a magnetic sensor, and the detector includes a magnetoresistive element and/or a Hall-effect element.

19. The sensor according to claim 1, wherein the sensor is arranged as a capacitive sensor.

* * * * *